(12) United States Patent
Kim et al.

(10) Patent No.: US 11,522,269 B2
(45) Date of Patent: Dec. 6, 2022

(54) CHIP ANTENNA

(71) Applicant: SAMSUNG ELECTRO-MECHANICS CO., LTD., Suwon-si (KR)

(72) Inventors: Chin Mo Kim, Suwon-si (KR); Sungyong An, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 27 days.

(21) Appl. No.: 17/318,417

(22) Filed: May 12, 2021

(65) Prior Publication Data
US 2022/0149505 A1  May 12, 2022

(30) Foreign Application Priority Data
Nov. 12, 2020 (KR) .................. 10-2020-0151255

(51) Int. Cl.
| | | |
|---|---|---|
| *H01Q 1/22* | (2006.01) | |
| *H01Q 9/04* | (2006.01) | |
| *H01L 23/66* | (2006.01) | |
| *H01Q 7/00* | (2006.01) | |
| *H01Q 1/24* | (2006.01) | |

(52) U.S. Cl.
CPC .......... *H01Q 1/2283* (2013.01); *H01L 23/66* (2013.01); *H01Q 7/00* (2013.01); *H01Q 9/0407* (2013.01); *H01Q 1/243* (2013.01)

(58) Field of Classification Search
CPC .......... H01Q 1/22; H01Q 1/2283; H01Q 1/24; H01Q 1/243; H01Q 9/04; H01Q 9/0407; H01Q 9/045; H01Q 9/16; H01Q 13/10; H01Q 13/106; H01Q 7/00
See application file for complete search history.

(56) References Cited

U.S. PATENT DOCUMENTS

| | | | | |
|---|---|---|---|---|
| 6,028,568 A | * | 2/2000 | Asakura ................. | H01Q 1/362 343/702 |
| 2003/0001794 A1 | * | 1/2003 | Park ....................... | H01Q 9/42 343/702 |
| 2003/0048225 A1 | * | 3/2003 | Yoon ....................... | H01Q 1/38 343/702 |
| 2003/0227411 A1 | * | 12/2003 | Kim ....................... | H01Q 1/243 343/702 |
| 2006/0145928 A1 | * | 7/2006 | Lee ....................... | H01Q 1/2283 343/702 |

(Continued)

FOREIGN PATENT DOCUMENTS

| | | |
|---|---|---|
| KR | 10-0691997 B1 | 3/2007 |
| KR | 10-0939478 B1 | 1/2010 |
| KR | 10-1003014 B1 | 12/2010 |

*Primary Examiner* — Thai Pham
(74) *Attorney, Agent, or Firm* — NSIP Law

(57) ABSTRACT

A chip antenna includes: a dielectric material block including a plurality of sides including a first side, a second side, and a third side that are different from each other; a first antenna portion including a first conductor pattern disposed on the first side; a second antenna portion including a second conductor pattern disposed on the second side; and a third antenna portion including a third conductor pattern disposed on the third side. The first conductor pattern, the second conductor pattern, and the third conductor pattern are respectively isolated on the first side, the second side, and the third side, and are independently positioned.

20 Claims, 13 Drawing Sheets

(56) References Cited

U.S. PATENT DOCUMENTS

| | | | |
|---|---|---|---|
| 2008/0122722 A1* | 5/2008 | Chang | H01Q 1/243 |
| | | | 343/860 |
| 2010/0220030 A1* | 9/2010 | Shimoda | H01Q 1/38 |
| | | | 343/860 |
| 2012/0242556 A1* | 9/2012 | Ando | H01Q 9/42 |
| | | | 343/834 |
| 2018/0205133 A1* | 7/2018 | Hashimoto | H01Q 13/106 |
| 2019/0173178 A1* | 6/2019 | Kato | H01Q 7/00 |

\* cited by examiner

CHIP ANTENNA

CROSS-REFERENCE TO RELATED APPLICATIONS

This application claims the benefit under 35 U.S.C. § 119(a) of Korean Patent Application No. 10-2020-0151255 filed on Nov. 12, 2020 in the Korean Intellectual Property Office, the entire disclosure of which is incorporated herein by reference for all purposes.

BACKGROUND

1. Field

The following description relates to a chip antenna.

2. Description of Related Art

A 5G communication system is realized in higher frequency (mmWave) bandwidths, for example, the bandwidths of 10 GHz to 100 GHz, to achieve higher data rates. To reduce a propagation loss of RF signals and increase a transmission distance, beamforming, large scale multiple-input multiple-output (MIMO), full dimensional multiple-input multiple-output, an array antenna, analog beamforming, and large scale antenna schemes are implemented in the 5G communication system field.

The current mobile communication traffic in the world is predicted to increase by an annual average of 53%, and the core industry of the fourth industrial revolution, such as the Internet of things (IoT), autonomous vehicles, virtual reality (VR), robots, and big data require a huge volume of data. Therefore, 5G communication is necessary.

In the earlier stage of the 5G service, a specific hotspot-based service is expected to be gradually developed into a wide area service securing mobility without limits of places and areas. Particularly, regarding the wide area service securing mobility, a base station increases the number of macro cells and small cells used, and a terminal requires high-power transmission and receiving for allowing middle and long distance transmission and receiving, so a large number of array antennae will be used.

However, as terminal down-sizing continues, it is necessary to reduce the size of an antenna and increase antenna efficiency. Therefore, chip antenna modules that are small enough to be installed in the mobile communication terminal and are appropriate for the GHz bandwidth are required.

The above information disclosed in this Background section is only for enhancement of understanding of the background of the invention, and therefore it may contain information that does not form the prior art that is already known in this country to a person of ordinary skill in the art.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a chip antenna includes: a dielectric material block including a plurality of sides including a first side, a second side, and a third side that are different from each other; a first antenna portion including a first conductor pattern disposed on the first side; a second antenna portion including a second conductor pattern disposed on the second side; and a third antenna portion including a third conductor pattern disposed on the third side. The first conductor pattern, the second conductor pattern, and the third conductor pattern are respectively isolated on the first side, the second side, and the third side, and are independently positioned.

At least one additional side, among the plurality of sides, that is different from the first, second, and third sides may include a ground portion.

The first side, the second side, and the third side may be orthogonal to each other.

The first conductor pattern, the second conductor pattern, and the third conductor pattern may include respective metal patches operable in a radiation pattern.

The first conductor pattern, the second conductor pattern, and the third conductor pattern may further include a respective ground patterns spaced from the respective metal patches and disposed to surround the metal patches.

The first conductor pattern, the second conductor pattern, and the third conductor pattern may be configured to be operated in a radiation pattern, and may include respective slot antenna patterns each including a metal plate in which a plurality of slots are positioned.

The first conductor pattern, the second conductor pattern, and the third conductor pattern may include at least two different types of antenna patterns.

The first conductor pattern may include a metal patch operable in a radiation pattern. The second conductor pattern and the third conductor pattern may include respective loop antenna patterns.

The first conductor pattern may include a metal patch operable in a radiation pattern. The second conductor pattern and the third conductor pattern may include respective dipole antenna patterns.

The first conductor pattern may include a metal patch operable in a radiation pattern. The second conductor pattern may include a dipole antenna pattern. The third conductor pattern may be operable in the radiation pattern and may include a slot antenna pattern including a metal plate in which a plurality of slots are positioned.

The plurality of sides may further include a fourth side facing the second side and a fifth side facing the third side. The chip antenna may further include a fourth antenna portion comprising a fourth conductor pattern disposed on the fourth side and a fifth antenna portion comprising a fifth conductor pattern disposed on the fifth side.

In another general aspect, a chip antenna includes: a dielectric material block array including a plurality of sides including a first side, a second side, and a third side facing in different directions, the dielectric material block array being formed by a plurality of dielectric material blocks arranged together such that adjacent dielectric material blocks, among the plurality of dielectric material blocks, contact each other; a first antenna portion including a first conductor pattern disposed on the first side; a second antenna portion including a second conductor pattern disposed on the second side; and a third antenna portion including a third conductor pattern disposed on the third side. The first conductor pattern, the second conductor pattern, and the third conductor pattern are respectively isolated on the first side, the second side, and the third side, and are independently positioned.

At least one additional side, among the plurality of sides, that is different from the first, second, and third sides may include a ground portion.

The first side, the second side, and the third side may be orthogonal to each other.

The first conductor pattern, the second conductor pattern, and the third conductor pattern may include respective metal patches operable in a radiation pattern.

The first conductor pattern, the second conductor pattern, and the third conductor pattern may further include respective ground patterns spaced from the respective metal patches and disposed to surround the respective metal patches.

The first conductor pattern, the second conductor pattern, and the third conductor pattern may include at least two different types of antenna patterns.

The first conductor pattern may include a metal patch operable in a radiation pattern. The second conductor pattern and third conductor pattern may include respective loop antenna patterns.

The first conductor pattern may include a metal patch operable in a radiation pattern. The second conductor pattern and the third conductor pattern may include respective dipole antenna patterns.

The first conductor pattern may include a metal patch operable in a radiation pattern. The second conductor pattern may include at least two among a metal patch, a loop antenna pattern, and a dipole antenna pattern operable in the radiation pattern. The third conductor pattern may be operable in the radiation pattern and may include a slot antenna pattern including a metal plate in which a plurality of slots are positioned.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
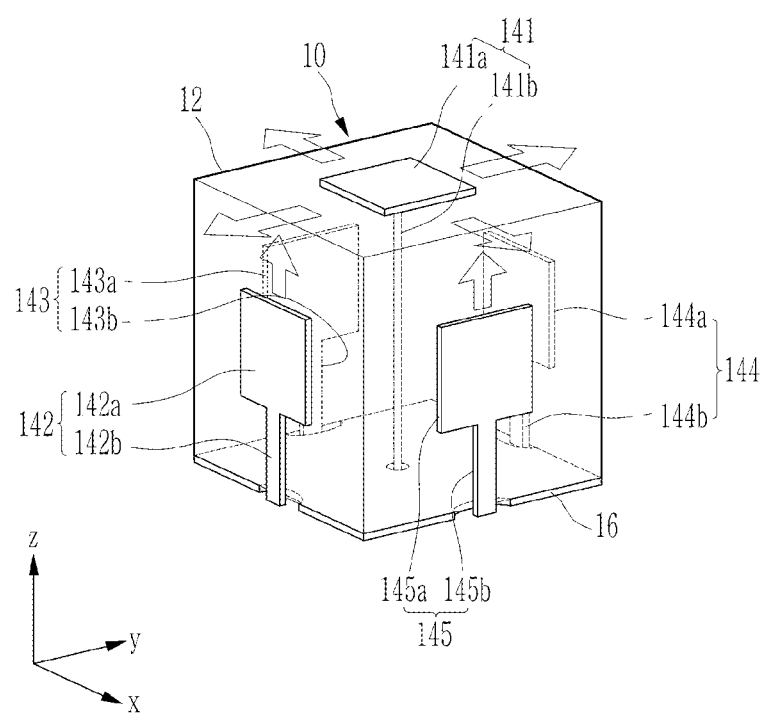
FIG. 1 is a perspective view of a chip antenna, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

A chip antenna module described herein is operable in a radio frequency region, for example, in a frequency bandwidth of equal to or greater than 3 GHz. For example, the chip antenna module may be operated in the bandwidth of 20 GHz to 60 GHz. The chip antenna module may be installed in an electronic device for receiving and/or transmitting RF signals. For example, the chip antenna may be installed in a portable phone, a portable laptop, or a drone, but an application of the chip antenna is not limited to such devices.

FIG. 1 is a perspective view of a chip antenna 10, according to an embodiment.

Referring to FIG. 1, the chip antenna 10 includes a dielectric material block 12 and a plurality of antenna portions having conductor patterns disposed on respective sides of the dielectric material block 12.

The dielectric material block 12 may have a hexahedral shape, and for example, may be made of a polymer or ceramic pellet having a predetermined dielectric constant. The dielectric material block 12 may include a first side, a second side, a third side, a fourth side, a fifth side, and a sixth side that are different from each other. The first side, the second side, and the third side may be configured to be orthogonal to each other. For example, the first side may be an upper side, and the second side and the third side may be lateral sides that are different from each other with reference to the drawing. In addition, the first side may face the sixth side, the second side may face the fourth side, and the third side may face the fifth side. For example, when the first side is the upper side, the sixth side may be a lower side, and the second side, the third side, the fourth side, and the fifth side may be lateral sides sequentially positioned in a clockwise direction with reference to the first side.

The plurality of antenna portions may include a first antenna portion 141, a second antenna portion 142, a third antenna portion 143, a fourth antenna portion 144, and a fifth antenna portion 145.

The first antenna portion 141 may be a first conductor pattern disposed on the first side of the dielectric material block 12 and may include a first metal patch 141a. The second antenna portion 142 may be a second conductor pattern disposed on the second side of the dielectric material block 12 and may include a second metal patch 142a. The the third antenna portion 143 may be a third conductor pattern disposed on a third side of the dielectric material block 12 and may include a third metal patch 143a. The fourth antenna portion 144 may be a fourth conductor pattern disposed on a fourth side of the dielectric material block 12 and may include a fourth metal patch 144a. The fifth antenna portion 145 may be a fifth conductor pattern disposed on a fifth side of the dielectric material block 12 and may include a fifth metal patch 145a.

The metal patches 141a, 142a, 143a, 144a, and 145a configuring the first, second, third, fourth, and fifth conductor patterns may be isolated on the respective sides of the dielectric material block 12 and may be independently positioned. That is, the first to fifth conductor patterns are not connected to each other, and the first, second, third, fourth, and fifth conductor patterns may be antennas respectively driven by feed lines 141b, 142b, 143b, 144b, and 145b that are individually installed corresponding to the first, second, third, fourth, and fifth conductor patterns. Therefore, the first antenna portion 141, the second antenna portion 142, the third antenna portion 143, the fourth antenna portion 144 and the fifth antenna portion 145 respectively including the first, second, third, fourth, and fifth conductor patterns may be isolated on the respective sides of the dielectric material block 12 and may be independently formed.

The first, second, third, fourth, and fifth metal patches 141a, 142a, 143a, 144a, and 145a may each be formed, for example, to have a quadrangular plane shape such as a rectangular shape or a square shape, and may be disposed in the center of the respective sides of the dielectric material block 12. The first, second, third, fourth, and fifth metal patches 141a, 142a, 143a, 144a, and 145a may be operable in a radiation pattern.

The first feed line 141b is connected to the first metal patch 141a and may include a feed via formed by making a via hole in the dielectric material block 12 and filling the via hole with a conductive material. The second, third, fourth, and fifth feed lines 142b, 143b, 144b, and 145b may be respectively connected to the second, third, fourth, and fifth metal patches 142a, 143a, 144a, and 145a, and the second, third, fourth, and fifth feed lines 142b, 143b, 144b, and 145b may each include a feed pattern extending in a long and narrow form from a respective one of the second, third, fourth, and fifth metal patches 142a, 143a, 144a, and 145a on the surface of the dielectric material block 12.

A ground portion 16 may be positioned on the sixth side of the dielectric material block 12. The ground portion 16 may, for example, be positioned on the sixth side of the dielectric material block 12 excluding portions on which the first, second, third, fourth, and fifth feed lines 141b, 142b, 143b, 144b, and 145b are positioned. For example, the sixth side of the dielectric material block 12 may be a side that is installed on a board to configure an antenna module.

The chip antenna 10 may be installed on the board to configure the antenna module. The board may be a circuit board on which a circuit or an electronic part needed by the chip antenna 10 is installed. For example, the board may be a printed circuit board (PCB) on which at least one electronic part is mounted. Therefore, circuit wires for electrically connecting electronic parts may be installed on the board. The board may be made of a flexible board, a ceramic board, and a glass board. For example, the first to fifth feed lines 141b, 142b, 143b, 144b, and 145b of the chip antenna 10 may be connected to different wires positioned on the board and may be individually driven.

The chip antenna 10 may form a radiation pattern on at least three sides of the dielectric material block 12 in a hexahedral shape. That is, when a radiation pattern such as a metal patch is positioned on the upper side of the dielectric material block 12, four-side radiation (in an x-y planar direction) is enabled, but radiation may be insufficient in a direction that is perpendicular to the upper side of the dielectric material block 12. Therefore, radiation in different axis directions in three dimensions may be realized, as marked with arrows in FIG. 1, by forming the radiation pattern on the upper side and the lateral sides of the dielectric material block 12.

Figure 2:
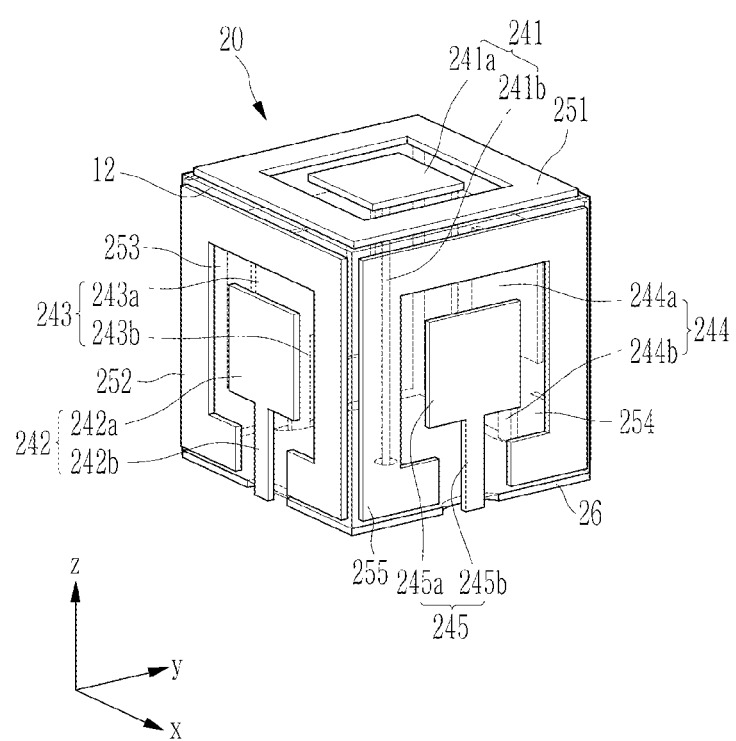
FIG. 2 is a perspective view of a chip antenna, according to another embodiment.

FIG. 2 is a perspective view of a chip antenna 20, according to another embodiment.

Referring to FIG. 2, the chip antenna 20 includes the dielectric material block 12 and a plurality of antenna portions having conductor patterns disposed on the respective sides of the dielectric material block 12. The dielectric material block 12 may be formed of the same material and have the same configuration described with reference to FIG. 1.

The plurality of antenna portions may include a first antenna portion 241, a second antenna portion 242, a third antenna portion 243, a fourth antenna portion 244, and a fifth antenna portion 245.

The first antenna portion 241 may be a first conductor pattern disposed on the first side of the dielectric material block 12 and may include a first metal patch 241a. The second antenna portion 242 may be a second conductor pattern disposed on the second side of the dielectric material block 12 and may include a second metal patch 242a. The third antenna portion 243 may be a third conductor pattern disposed on the third side of the dielectric material block 12 and may include a third metal patch 243a. The fourth antenna portion 244 may be a fourth conductor pattern disposed on the fourth side of the dielectric material block 12 and may include a fourth metal patch 244a. The fifth antenna portion 245 may be a fifth conductor pattern disposed on the fifth side of the dielectric material block 12 and may include a fifth metal patch 245a.

Further, the chip antenna 20 may include ground patterns 251, 252, 253, 254, and 255 separated from the first, second, third, fourth, and fifth metal patches 241a, 242a, 243a, 244a, and 245a and disposed to surround a respective metal patch among the first, second, third, fourth, and fifth metal patches 241a, 242a, 243a, 244a, and 245a on the respective sides of the dielectric material block 12.

The first, second, third, fourth, and fifth metal patches 241a, 242a, 243a, 244a, and 245a configuring the first, second, third, fourth, and fifth conductor patterns may be isolated on the respective sides of the dielectric material block 12 and may be independently formed. That is, the first to fifth conductor patterns are not connected to each other, and the first, second, third, fourth, and fifth conductor patterns may be antennas respectively driven by first, second, third, fourth, and fifth feed lines 241b, 242b, 243b, 244b, and 245b that are individually installed corresponding to the first, second, third, fourth, and fifth conductor patterns. Therefore, the first antenna portion 241, the second antenna portion 242, the third antenna portion 243, the fourth antenna portion 244, and the fifth antenna portion 245 respectively including the conductor patterns may be isolated on the respective sides of the dielectric material block 12 and may be independently formed.

The first, second, third, fourth, and fifth metal patches 241a, 242a, 243a, 244a, and 245a may each be formed, for example, to have a quadrangular plane shape such as a rectangular shape or a square shape, and may be disposed in the center of the respective sides of the dielectric material block 12. The first, second, third, fourth, and fifth metal patches 241a, 242a, 243a, 244a, and 245a may be operable in the radiation pattern.

A ground portion 26 may be positioned on the sixth side of the dielectric material block 12. The ground portion 26 may, for example, be positioned on the sixth side of the dielectric material block 12 excluding portions on which the first, second, third, fourth, and fifth feed lines 241b, 242b, 243b, 244b, and 245b are positioned. The sixth side of the dielectric material block 12 may be a side that is installed on a board to configure an antenna module.

Figure 3:
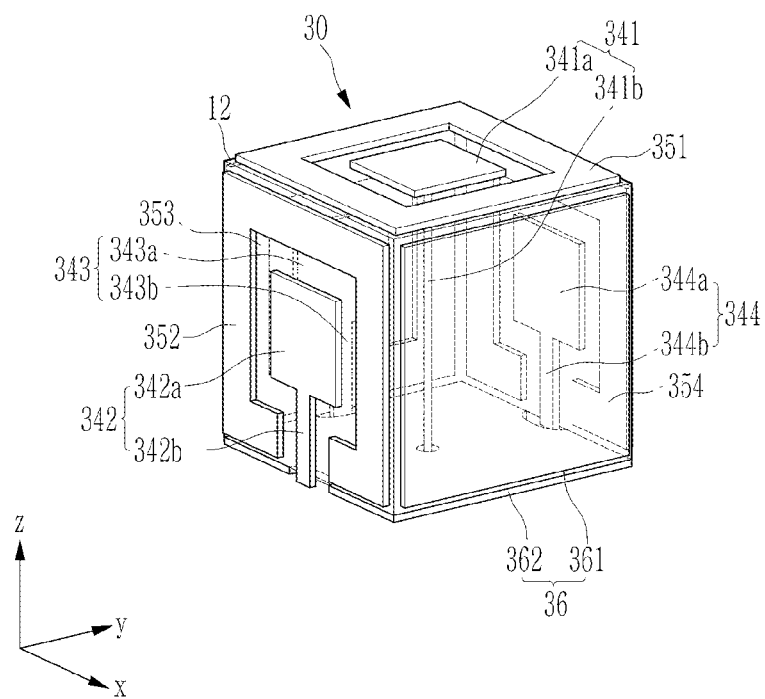
FIG. 3 is a perspective view of a chip antenna, according to another embodiment.

FIG. 3 is a perspective view of a chip antenna 30, according to another embodiment.

Referring to FIG. 3, the chip antenna 30 includes the dielectric material block 12 and a plurality of antenna portions having conductor patterns disposed on four adjacent sides of the dielectric material block 12. A ground portion 36 may be positioned on two sides on which the antenna portions are not positioned. The dielectric material block 12 may be formed of the same material and may have the same configuration described with reference to FIG. 1.

The plurality of antenna portions may include a first antenna portion 341, a second antenna portion 342, a third antenna portion 343, and a fourth antenna portion 344.

The first antenna portion 341 may be a first conductor pattern disposed on the first side of the dielectric material block 12 and may include a first metal patch 341a. The second antenna portion 342 may be a second conductor pattern disposed on the second side of the dielectric material block 12 and may include a second metal patch 342a. The third antenna portion 343 may be a third conductor pattern disposed on the third side of the dielectric material block 12 and may include a third metal patch 343a. The fourth antenna portion 344 may be a fourth conductor pattern disposed on the fourth side of the dielectric material block 12 and may include a fourth metal patch 344a.

The chip antenna 30 may further include ground patterns 351, 352, 353, and 354 separated from the first, second, third, and fourth metal patches 341a, 342a, 343a, and 344a and disposed to surround a respective metal patch among the first, second, third, and fourth metal patches 341a, 342a, 343a, and 344a on the four sides of the dielectric material block 12.

The metal patches 341a, 342a, 343a, and 344a configuring the first, second, third, and fourth conductor patterns may be isolated on the respective sides of the dielectric material block 12 and may be independently formed. That is, the first to fourth conductor patterns are not connected to each other, and the first, second, third, and fourth conductor patterns may be antennas respectively driven by first, second, third, and fourth feed lines 341b, 342b, 343b, and 344b that are individually installed. Therefore, the first antenna portion 341, the second antenna portion 342, the third antenna portion 343, and the fourth antenna portion 344 respectively including the first, second, third, and fourth conductor patterns may be isolated on the respective sides of the dielectric material block 12 and may be independently formed.

The first, second, third, and fourth metal patches 341a, 342a, 343a, and 344a may each be formed, for example, to have a quadrangular plane shape such as a rectangular shape or a square shape, and may be disposed in the center of the respective sides of the dielectric material block 12. The first, second, third, and fourth metal patches 341a, 342a, 343a, and 344a may be operable in a radiation pattern.

The ground portion 36 may be formed on the two remaining sides of the dielectric material block 12 in which the antenna portions are not formed. That is, conductive plates 361 and 362 forming the ground portion 36 may be formed on the fifth side and the sixth side of the dielectric material block 12. The sixth side of the dielectric material block 12 may be a side installed on a board so as to configure an antenna module.

Figure 4:
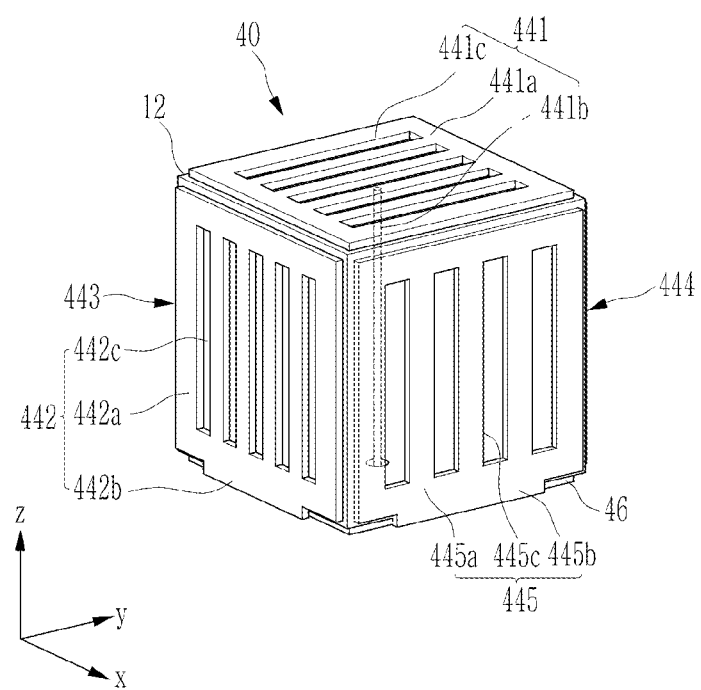
FIG. 4 shows a perspective view of a chip antenna, according to another embodiment.

FIG. 4 shows a perspective view of a chip antenna 40, according to another embodiment.

Referring to FIG. 4, the chip antenna 40 includes the dielectric material block 12 and a plurality of antenna portions having conductor patterns disposed on the respective sides of the dielectric material block 12. The dielectric material block 12 may be formed of the same material and may have the same configuration described with reference to FIG. 1.

The plurality of antenna portions may include a first antenna portion 441, a second antenna portion 442, a third antenna portion 443, a fourth antenna portion 444, and a fifth antenna portion 445. A plurality of antenna portions are operable in a radiation pattern, and may each include a slot antenna pattern formed by a metal plate on which a plurality of slots are positioned.

That is, the first antenna portion 441 may be a first conductor pattern disposed on the first side of the dielectric material block 12 and may include a metal plate 441a in which a plurality of slots 441c are positioned. The second antenna portion 442 may be a second conductor pattern disposed on the second side of the dielectric material block 12 and may include a metal plate 442a in which a plurality of slots 442c are positioned. The third antenna portion 443 may be a third conductor pattern disposed on the third side of the dielectric material block 12 and may include a metal plate in which a plurality of slots are positioned. The fourth antenna portion 444 may be a fourth conductor pattern disposed on the fourth side of the dielectric material block 12 and may include a metal plate in which a plurality of slots are positioned. The fifth antenna portion 445 may be a fifth conductor pattern disposed on the fifth side of the dielectric material block 12 and may include a metal plate 445a in which a plurality of slot 445c are positioned.

The respective metal plates of the first conductor pattern to the fifth conductor pattern may be isolated on the respective sides of the dielectric material block 12 and may be independently formed. That is, the first, second, third, fourth, and fifth conductor patterns are not connected to each other, and the first, second, third, fourth, and fifth conductor patterns may be antennas respectively driven by the feed lines that are individually installed. In this instance, the feed lines may be formed by making a feed via in the dielectric material block 12 or extending the metal plate positioned on the lateral side of the dielectric material block 12. For example, FIG. 4 illustrates a configuration in which a feed line 441b of the first antenna portion 441 is made of a feed via and is connected to the metal plate 441a, a feed line 442b of the second antenna portion 442 extends downward from the metal plate 442b, and a feed line 445b of the fifth antenna portion 445 extends downward from the metal plate 445b. Feed lines of the third antenna portion 443 and the fourth antenna portion 444 may be configured in a manner similar to that of the feed line structure of the second antenna portion 442 and the fifth antenna portion 445. Therefore, the first antenna portion 441, the second antenna portion 442, the third antenna portion 443, the fourth antenna portion 444, and the fifth antenna portion 445 respectively including the first, second, third, fourth, and fifth conductor patterns may be isolated on the respective sides of the dielectric material block 12 and may be independently formed.

A ground portion 46 may be positioned on the sixth side of the dielectric material block 12. For example, the ground portion 46 may be positioned on the entire sixth side of the dielectric material block 12 excluding portions where the feed lines are positioned. The sixth side of the dielectric material block 12 may be a side installed on a board to configure an antenna module.

Figure 5:
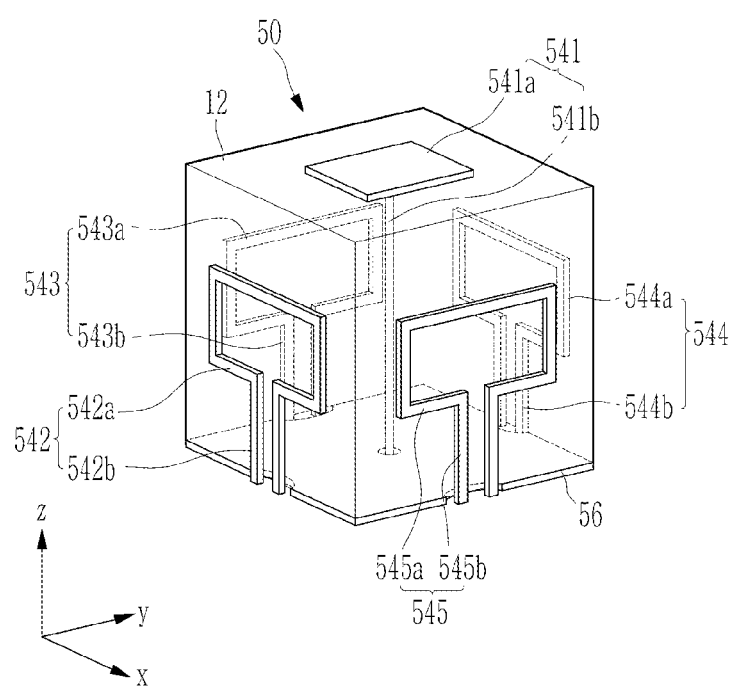
FIG. 5 shows a perspective view of a chip antenna according to still another embodiment of the present invention.
Figure 6:
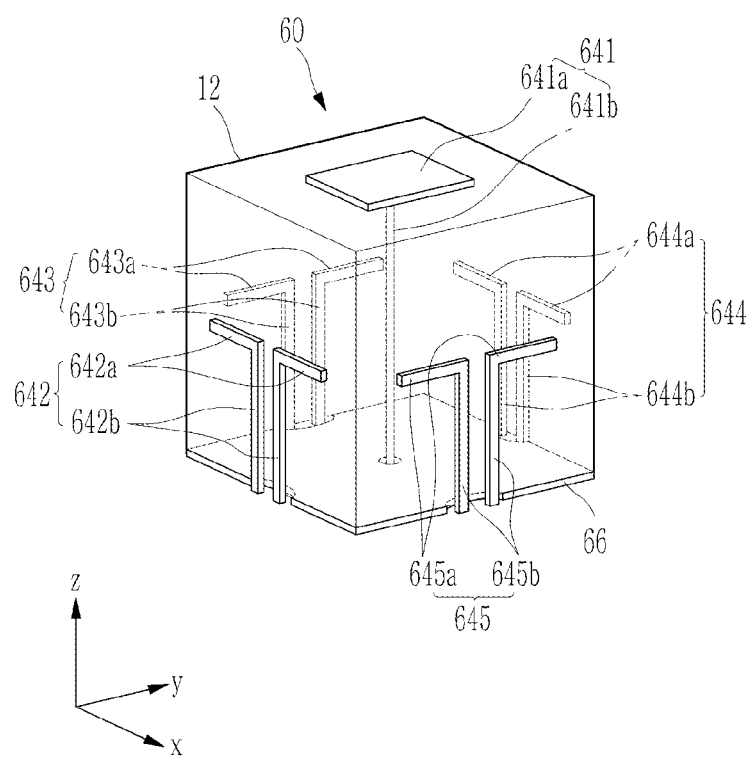
FIG. 6 is a perspective view of a chip antenna, according to another embodiment.
Figure 7:
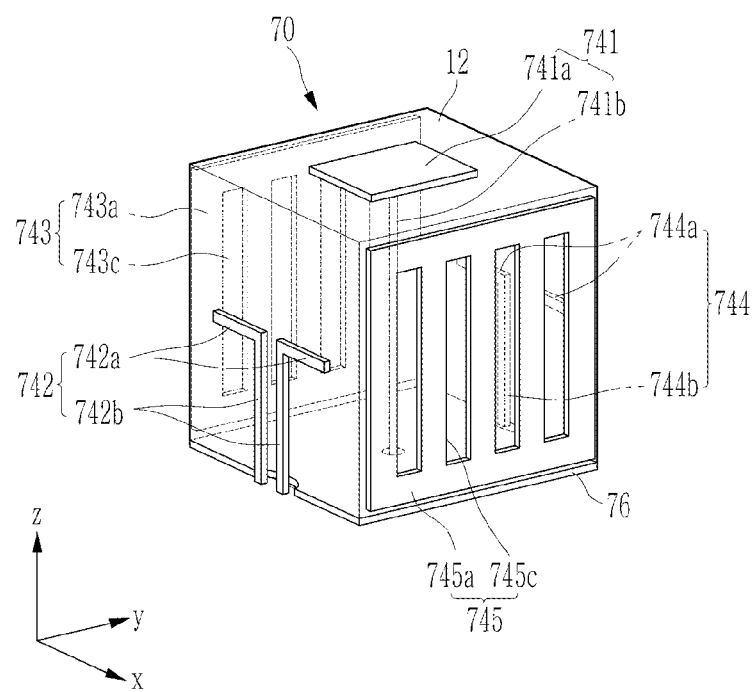
FIG. 7 is a perspective view of a chip antenna, according to another embodiment of the present invention.

FIG. 5 to FIG. 7 are perspective views of chip antennas, according to other embodiments.

Referring to FIG. 5 to FIG. 7, the respective chip antennas 50, 60, and 70 each include a plurality of antenna portions having conductor patterns disposed on the dielectric material block 12 and the respective sides of the dielectric material block 12. The plurality of antenna portions may include at least two different types of antenna patterns, and the dielectric material block 12 may be formed of the same material and have the same configuration as described with reference to FIG. 1.

Referring to FIG. 5, the plurality of antenna portions may include a first antenna portion 541, a second antenna portion 542, a third antenna portion 543, a fourth antenna portion 544, and a fifth antenna portion 545. The first antenna portion 541 may be a first conductor pattern disposed on the first side of the dielectric material block 12 and may include a metal patch 541a. The second antenna portion to the fifth antenna portion 542, 543, 544, and 545 may be second, third, fourth, and fifth conductor patterns respectively disposed on the second, third, fourth and fifth sides of the dielectric material block 12, and may include loop antenna patterns 542a, 543a, 544a, and 545a, respectively.

The metal patch 541a configuring the first conductor pattern and the loop antenna patterns 542a, 543a, 544a, and 545a respectively configuring the second, third, fourth, and fifth conductor patterns may be isolated on the respective sides of the dielectric material block 12 and may be independently formed. That is, the first, second, third, fourth, and fifth conductor patterns are not connected to each other, and may be antennas respectively driven by first, second, third, fourth, and fifth feed lines 541b, 542b, 543b, 544b, and 545b that are individually installed. Therefore, the first antenna portion 541, the second antenna portion 542, the third antenna portion 543, the fourth antenna portion 544, and the fifth antenna portion 545 respectively including the first, second, third, fourth, and fifth conductor patterns may be isolated on the respective sides of the dielectric material block 12 and may be independently formed.

A ground portion 56 may be positioned on the sixth side of the dielectric material block 12. For example, the ground portion 56 may be positioned on the entire sixth side of the dielectric material block 12 excluding portions where the first, second, third, fourth, and fifth feed lines 541b, 542b, 543b, 544b, and 545b are positioned. The sixth side of the dielectric material block 12 may be a side installed on the board to configure an antenna module.

Referring to FIG. 6, the plurality of antenna portions may include a first antenna portion 641, a second antenna portion 642, a third antenna portion 643, a fourth antenna portion 644, and a fifth antenna portion 645. The first antenna portion 641 may be a first conductor pattern disposed on the first side of the dielectric material block 12 and may include a metal patch 641a. The second, third, fourth, and fifth antenna portions 642, 643, 644, and 645 may be second, third, fourth, and fifth conductor patterns respectively disposed on the second, third, fourth, and fifth sides of the dielectric material block 12, and may include dipole antenna patterns 642a, 643a, 644a, and 645a, respectively.

The metal patch 641a configuring the first conductor pattern and the dipole antenna patterns 642a, 643a, 644a, and 645a respectively configuring the second, third, fourth, and fifth conductor patterns may be isolated on the respective sides of the dielectric material block 12 and may be independently formed. That is, the second, third, fourth, and fifth conductor patterns are not connected to each other, and the first, second, third, fourth, and fifth conductor patterns may be antenna respectively driven by first, second, third, fourth, and fifth feed lines 641b, 642b, 643b, 644b, and 645b that are individually installed. Therefore, the first antenna portion 641, the second antenna portion 642, the third antenna portion 643, the fourth antenna portion 644, and the fifth antenna portion 645 respectively including the first, second, third, fourth, and fifth conductor patterns may be isolated on the respective sides of the dielectric material block 12 and may be independently formed.

A ground portion 66 may be positioned on the sixth side of the dielectric material block 12. For example, the ground portion 66 may be positioned on the entire sixth side of the dielectric material block 12 excluding a portion where the first, second, third, fourth, and fifth feed lines 641b, 642b, 643b, 644b, and 645b are positioned.

Referring to FIG. 7, the plurality of antenna portions may include a first antenna portion 741, a second antenna portion 742, a third antenna portion 743, a fourth antenna portion 744, and a fifth antenna portion 745. The first antenna portion 741 may be a first conductor pattern disposed on the first side of the dielectric material block 12 and may include a metal patch 741a. The second antenna portion 742 and the fourth antenna portion 744 may be, respectively, a second conductor pattern and a fourth conductor pattern respectively disposed on the second side and the fourth side, facing each other, of the dielectric material block 12. The second antenna portion 742 and the fourth antenna portion 744 may include dipole antenna patterns 742a and 744a, respectively. The third antenna portion 743 and the fifth antenna portion 745 may be, respectively, a third conductor pattern and a fifth conductor pattern respectively disposed on the third side and the fifth side, facing each other, of the dielectric material block 12. The third antenna portion 743 and the fifth antenna portion 745 may include metal plates 743a and 745a, respectively, in which a plurality of slots 743c and 745c are respectively formed. That is, the metal plates 743a and 745a may form slot antenna patterns.

The metal patch 741a configuring the first conductor pattern, the dipole antenna patterns 742a and 744a respectively configuring the second and fourth conductor patterns, and the metal plates 743a and 745a forming slot antenna patterns respectively configuring the third and fifth conductor patterns may be isolated on the respective sides of the dielectric material block 12 and may be independently formed. That is, the first, second, third, fourth, and fifth conductor patterns are not connected to each other, and the first, second, third, fourth, and fifth conductor patterns may be antennas respectively driven by feed lines that are individually installed. That is, the metal patch 741a may be connected to a feed line 741b formed of a feed via, the dipole antenna patterns 742a and 744a may be respectively connected to feed lines 742b and 744b respectively extending therefrom, and the metal plates 743a and 745a may include feed lines respectively extending therefrom. Therefore, the first antenna portion 741, the second antenna portion 742, the third antenna portion 743, the fourth antenna portion 744, and the fifth antenna portion 745 respectively including the first, second, third, fourth, and fifth conductor patterns may be isolated on the respective sides of the dielectric material block 12 and may be independently formed.

A ground portion 76 may be positioned on the sixth side of the dielectric material block 12. For example, the ground portion 76 may be positioned on the entire sixth side of the dielectric material block 12 excluding portions where the feed lines are positioned.

Embodiments to be described hereinafter may provide chip antennas with an array structure considering an installation space, by expanding the chip antennas configured with a single dielectric material block described with reference to FIG. 1 to FIG. 7. The array-structured chip antenna may individually and independently form an antenna pattern on the respective sides of a dielectric material block array configured by combining a plurality of dielectric material blocks.

The array-structured chip antenna may include, for example, four dielectric material blocks disposed in a 1×4 arrangement, and may form a conductor pattern on the surfaces of the respective dielectric material blocks exposed to the outside, as shown in FIG. 8 to FIG. 13. However, the disclosure herein is not limited to these examples, and the array-structured chip antenna may include, for example, a dielectric material block in various arrangements such as 3×3, 2×4, or 3×4 and a conductor pattern formed on an exposed surface of the dielectric material block array so as to have a shape according to an installation space.

Figure 8:
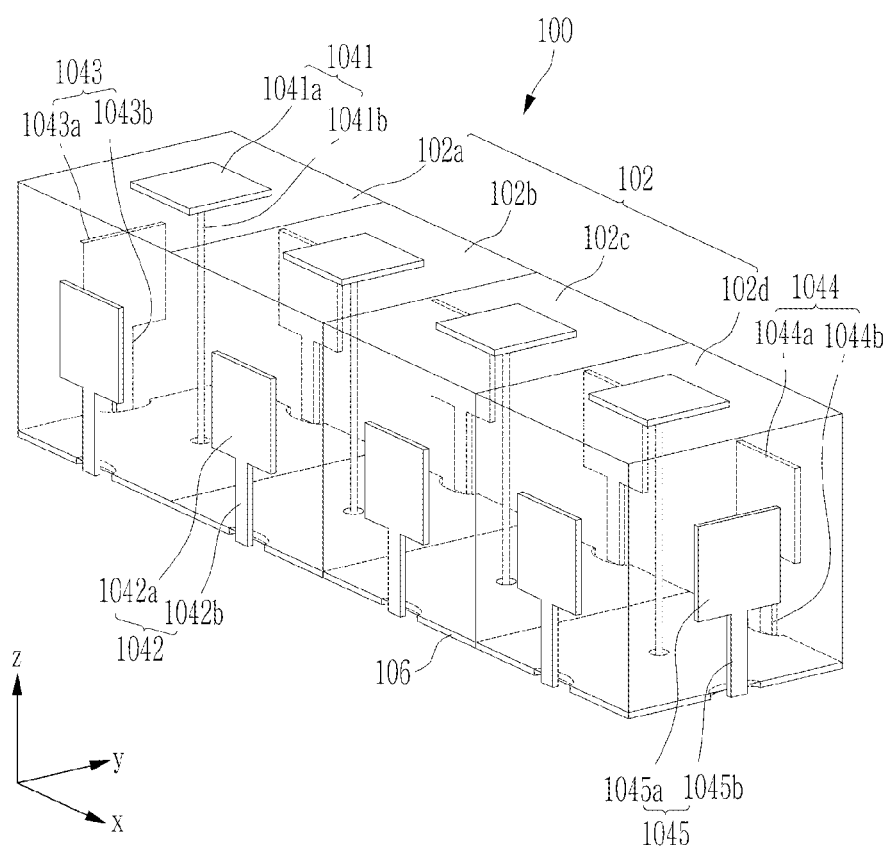
FIG. 8 is a perspective view of a chip antenna, according to another embodiment.

FIG. 8 is a perspective view of a chip antenna 100, according to an embodiment.

Referring to FIG. 8, the chip antenna 100 includes a plurality of antenna portions having conductor patterns disposed on the respective sides of a dielectric material block array 102.

The dielectric material block array 102 may include a plurality of dielectric material blocks 102a, 102b, 102c, and 102d adjacently arranged to have sides contacting each other. The respective dielectric material blocks 102a, 102b, 102c, and 102d may have hexahedral shapes and, for example, may be made of polymer or ceramic pellets having a predetermined dielectric constant. The dielectric material block array 102 includes a first side, a second side, a third side, a fourth side, a fifth side, and a sixth side that are different from each other. The first side, the second side, and the third side may be configured to be orthogonal to each other. For example, the first side may be an upper side, and the second side and the third side may be different lateral sides with reference to the drawing. The first side may face the sixth side, the second side may face the fourth side, and the third side may face the fifth side. For example, when the first side is the upper side, the sixth side may be a lower side, and the second side, the third side, the fourth side, and the fifth side may be lateral sides sequentially positioned in a clockwise direction with respect to the first side.

Regarding the dielectric material block array 102 shown in FIG. 8, the first side, the second side, the fourth side, and the sixth side may include an upper side, two lateral sides, and a lower side of the four sequential unit dielectric material blocks 102a, 102b, 102c, and 102d. The third side and the fifth side may correspond to the lateral sides of the outermost unit dielectric material blocks 102a and 102d disposed outermost.

The plurality of antenna portions may include a first antenna portion 1041, a second antenna portion 1042, a third antenna portion 1043, a fourth antenna portion 1044, and a fifth antenna portion 1045. The first antenna portion 1041 may be a first conductor pattern disposed on the first side of the dielectric material block array 102 and may include a first metal patch 1041a. The second antenna portion 1042 may be a second conductor pattern disposed on the second side of the dielectric material block array 102 and may include a second metal patch 1042a. The third antenna portion 1043 may be a third conductor pattern disposed on the third side of the dielectric material block array 102 and may include a third metal patch 1043a. The fourth antenna portion 1044 may be a fourth conductor pattern disposed on the fourth side of the dielectric material block array 102 and may include a fourth metal patch 1044a. The fifth antenna portion 1045 may be a fifth conductor pattern disposed on the fifth side of the dielectric material block array 102 and may include a fifth metal patch 1045a.

The first metal patch 1041a, the second metal patch 1042a, and the fourth metal patch 1044a are respectively isolated on the sides of the four sequential unit dielectric material blocks 102a, 102b, 102c, and 102d, are independently disposed, and may be operable in a radiation pattern. The third metal patch 1043a and the fifth metal patch 1045a are respectively isolated on the lateral sides of the outermost unit dielectric material blocks 102a and 102d, are independently disposed, and may be operable in the radiation pattern.

The first, second, third, fourth, and fifth metal patches 1041a, 1042a, 1043a, 1044a, and 1045a may have, for example, a quadrangular shape such as a rectangular shape or a square shape in a plan view, and may be disposed in respective centers of the sides of the unit dielectric material blocks 102a, 102b, 102c, and 102d.

The metal patches 1041a, 1042a, 1043a, 1044a, and 1045a configuring the first, second, third, fourth, and fifth conductor patterns may be isolated on the respective sides of the dielectric material block array 102 and may be independently formed. That is, the first, second, third, fourth, and fifth conductor patterns are not connected to each other, and may be antennas respectively driven by first, second, third, fourth, and fifth feed lines 1041b, 1042b, 1043b, 1044b, and 1045b that are individually installed. Therefore, the first antenna portion 1041, the second antenna portion 1042, the third antenna portion 1043, the fourth antenna portion 1044, and the fifth antenna portion 1045 respectively including the first, second, third, fourth, and fifth conductor patterns may be isolated on the respective sides of the dielectric material block array 102 and may be independently formed.

A ground portion 106 may be positioned on the sixth side of the dielectric material block array 102. The ground portion 106 may, for example, be positioned on the entire sixth side of the dielectric material block array 102 excluding the portions where the first, second, third, fourth, and fifth feed lines 1041b, 1042b, 1043b, 1044b, and 1045b feed lines are positioned. The sixth side of the dielectric material block array 102 may be a side installed on a board so as to configure an antenna module.

Figure 9:
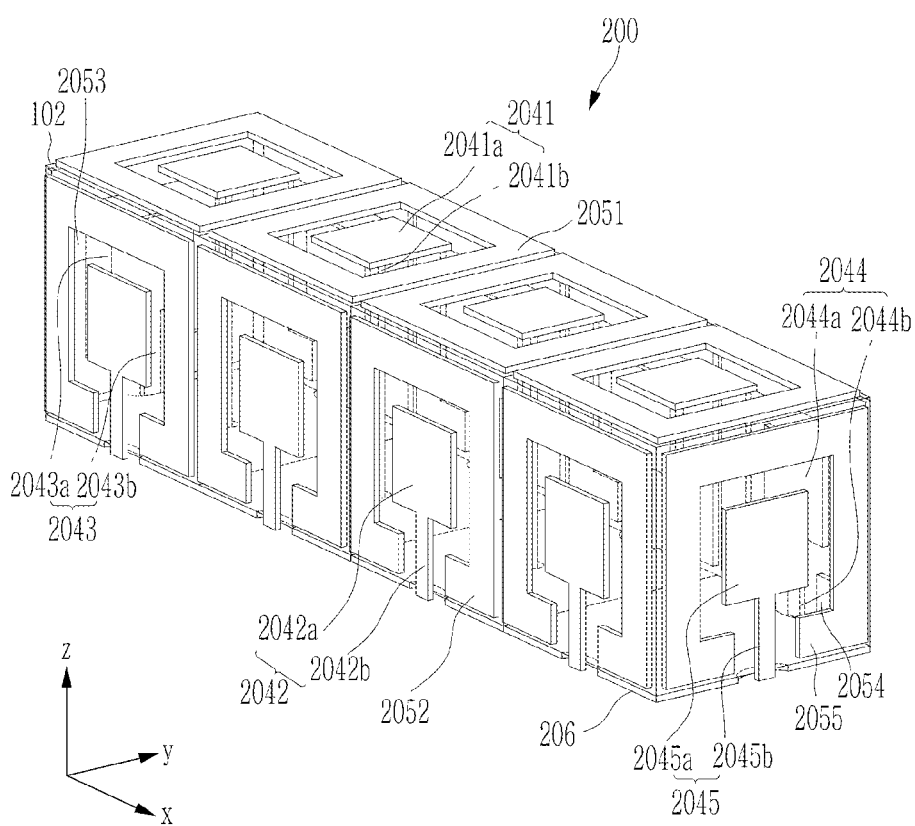
FIG. 9 is a perspective view of a chip antenna, according to another embodiment.

FIG. 9 is a perspective view of a chip antenna 200, according to another embodiment.

Referring to FIG. 9, the chip antenna 200 includes a plurality of antenna portions having conductor patterns disposed on the respective sides of the dielectric material block array 102. The dielectric material block array 102 may be formed of the same material and have the same configuration described with reference to FIG. 8.

The plurality of antenna portions may include a first antenna portion 2041, a second antenna portion 2042, a third antenna portion 2043, a fourth antenna portion 2044, and a fifth antenna portion 2045. The first antenna portion 2041 may be a first conductor pattern disposed on the first side of the dielectric material block array 102 and may include a first metal patch 2041a. The second antenna portion 2042 may be a second conductor pattern disposed on the second side of the dielectric material block array 102 and may include a second metal patch 2042a. The third antenna portion 2043 may be a third conductor pattern disposed on the third side of the dielectric material block array 102 and may include a third metal patch 2043a. The fourth antenna portion 2044 may be a fourth conductor pattern disposed on the fourth side of the dielectric material block array 102 and may include a fourth metal patch 2044a. The fifth antenna portion 2045 may be a fifth conductor pattern disposed on the fifth side of the dielectric material block array 102 and may include a fifth metal patch 2045a.

The first metal patch 2041a, the second metal patch 2042a, and the fourth metal patch 2044a are respectively isolated on the sides of the four sequential unit dielectric material blocks 102a, 102b, 102c, and 102d (refer to FIG. 8), are independently disposed, and may be operable in a radiation pattern. The third metal patch 2043a and the fifth metal patch 2045a may be isolated on the lateral sides of the outermost unit dielectric material blocks 102a and 102d, are independently disposed, and may be operable in the radiation pattern.

The metal patches 2041a, 2042a, 2043a, 2044a, and 2045a may be made, for example, to have a quadrangular shape such as a rectangular shape or a square shape in a plan view, and may be disposed in respective centers of the sides of the unit dielectric material blocks 102a, 102b, 102c, and 102d.

Further, the chip antenna 200 may include first, second, third, fourth, and fifth ground patterns 2051, 2052, 2053, 2054, and 2055 separated from the first, second, third, fourth, and fifth metal patches 2041a, 2042a, 2043a, 2044a, and 2045a and disposed to surround a respective metal patch among the first, second, third, fourth and fifth metal patches on the respective sides of the dielectric material block array 102.

The first, second, third, fourth, and fifth metal patches 2041a, 2042a, 2043a, 2044a, and 2045a configuring the first, second, third, fourth, and fifth conductor patterns may be isolated on the respective sides of the dielectric material block array 102 and may be independently formed. That is, the first, second, third, fourth, and fifth conductor patterns are not connected to each other, and may be antennas respectively driven by first, second, third, fourth, and fifth feed lines 2041b, 2042b, 2043b, 2044b, and 2045b that are individually installed. Therefore, the first antenna portion 2041, the second antenna portion 2042, the third antenna portion 2043, the fourth antenna portion 2044, and the fifth antenna portion 2045 respectively including the first, second, third, fourth, and fifth conductor patterns may be isolated on the respective sides of the dielectric material block array 102 and may be independently formed.

A ground portion 206 may be positioned on the sixth side of the dielectric material block array 102. The ground portion 206 may, for example, be positioned on the entire sixth side of the dielectric material block array 102 excluding the portions where the first, second, third, fourth, and fifth feed lines 2041b, 2042b, 2043b, 2044b, and 2045b are positioned.

Figure 10:
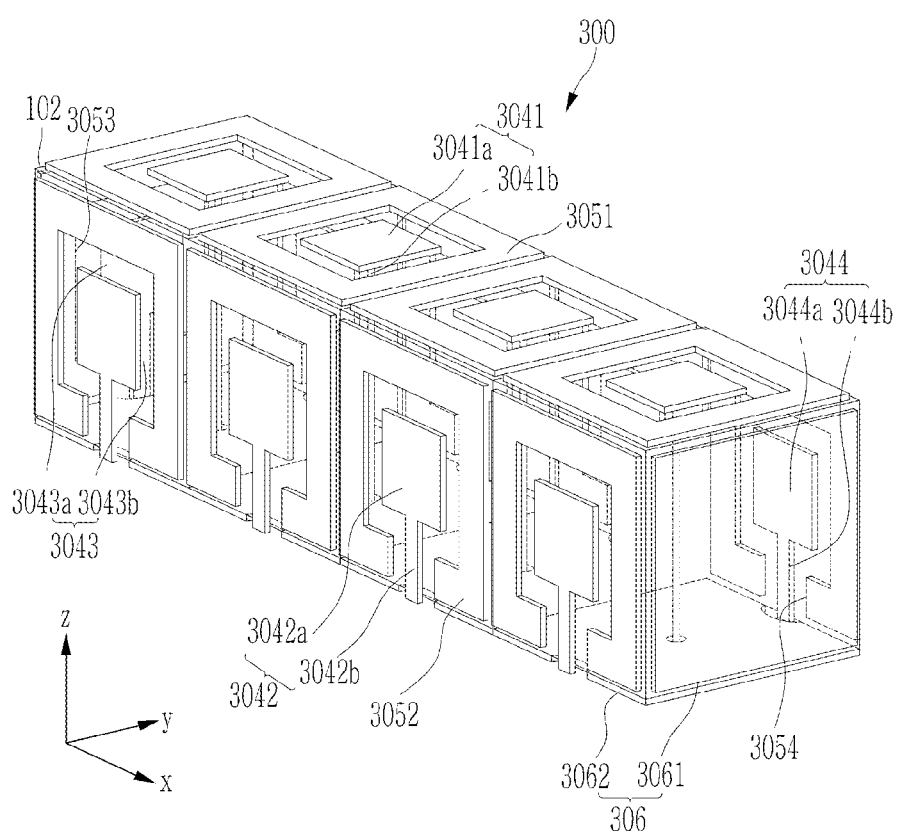
FIG. 10 is a perspective view of a chip antenna, according to another embodiment.

FIG. 10 is a perspective view of a chip antenna 300, according to another embodiment.

Referring to FIG. 10, the chip antenna 300 includes the dielectric material block array 102 and a plurality of antenna portions having conductor patterns disposed on four adjacent sides of the dielectric material block array 102. A ground portion 306 may be positioned on two sides on which the antenna portions are not provided.

The plurality of antenna portions may include a first antenna portion 3041, a second antenna portion 3042, a third antenna portion 3043, and a fourth antenna portion 3044. The first antenna portion 3041 may be a first conductor pattern disposed on the first side of the dielectric material block array 102 and may include a first metal patch 3041a. The second antenna portion 3042 may be a second conductor pattern disposed on the second side of the dielectric material block array 102 and may include a second metal patch 3042a. The third antenna portion 3043 may be a third conductor pattern disposed on the third side of the dielectric material block array 102 and may include a third metal patch 3043a. The fourth antenna portion 3044 may be a fourth conductor pattern disposed on the fourth side of the dielectric material block array 102 and may include a fourth metal patch 3044a.

The first metal patch 3401a, the second metal patch 3402a, and the fourth metal patch 3044a may be isolated on the sides of the four sequential unit dielectric material blocks 102a, 102b, 102c, and 102d (refer to FIG. 8), are independently disposed, and may be operable in a radiation pattern. The third metal patch 3043a may be isolated on the lateral side of the outermost unit dielectric material block 102a, may be disposed, and may be operable in the radiation pattern.

The first, second, third, and fourth metal patches 3041a, 3042a, 3043a, and 3044a may have, for example, a quadrangular shape such as a rectangle shape or a square shape in a plan view, and may be disposed in respective centers of the sides of the unit dielectric material blocks 102a, 102b, 102c, and 102d.

Further, the chip antenna 300 may include first, second, third, and fourth ground patterns 3041c, 3042c, 3043c, and 3044c separated from the first, second, third, and fourth metal patches 3041a, 3042a, 3043a, and 3044a and disposed to surround a respective metal patch among the first, second, third, and fourth metal patches on the respective sides of the dielectric material block array 102.

The metal patches 3041a, 3042a, 3043a, and 3044a configuring the first, second, third, and fourth conductor patterns may be isolated on the respective sides of the dielectric material block array 102 and may be independently formed. That is, the first, second, third, and fourth conductor patterns are not connected to each other, and may be antennas respectively driven by the feed lines 3041b, 3042b, 3043b, and 3044b that are individually installed. Therefore, the first antenna portion 3041, the second antenna portion 3042, the third antenna portion 3043, the fourth antenna portion 3044, and the fifth antenna portion 3045 respectively including the first, second, third, and fourth conductor patterns may be isolated on the respective sides of the dielectric material block array 102 and may be independently formed.

The ground portion 306 may be formed on two sides on which the antenna portions are not formed in the dielectric material block array 102. That is, conductive plates 3061 and 3062 forming the ground portion 306 may be positioned on the fifth side and the sixth side of the dielectric material block array 102.

Figure 11:
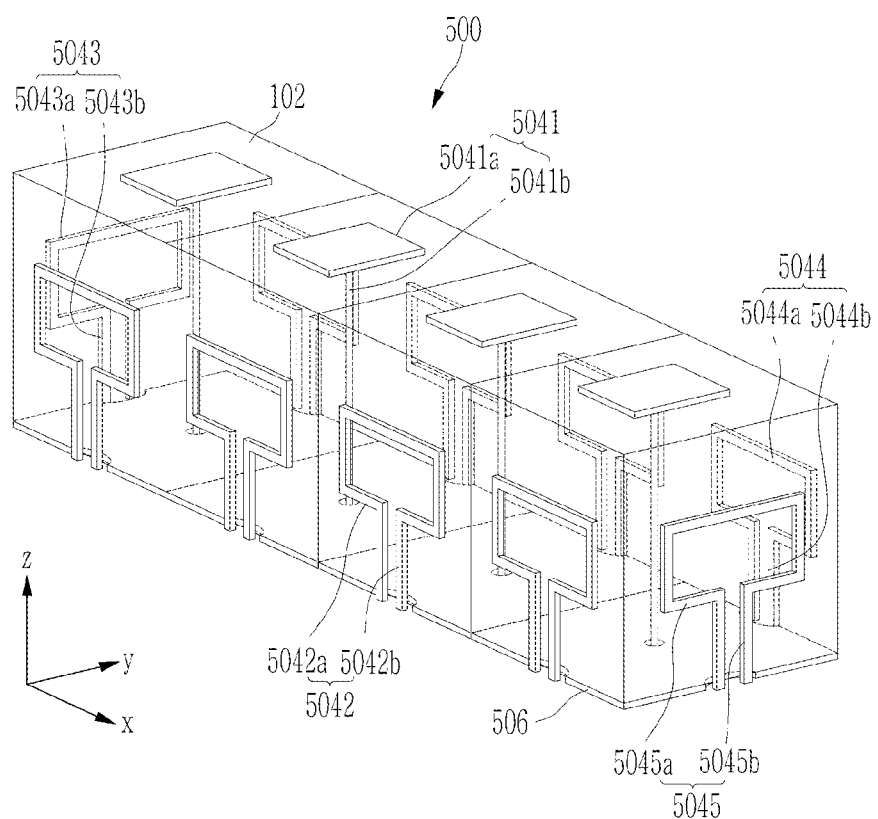
FIG. 11 is a perspective view of a chip antenna, according to another embodiment.
Figure 12:
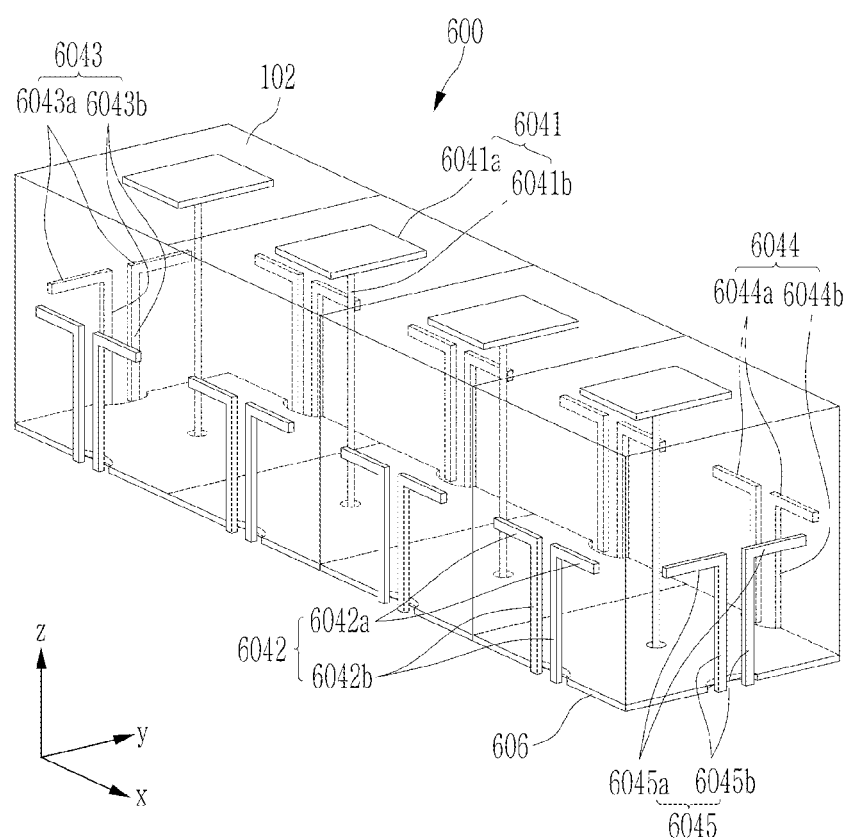
FIG. 12 is a perspective view of a chip antenna, according to another embodiment.

FIG. 11 and FIG. 12 show perspective views of chip antennas 500 and 600, respectively, according to other embodiments.

Referring to FIG. 11 and FIG. 12, the chip antennas 500 and 600 each include a plurality of antenna portions having conductor patterns disposed on the respective sides of the dielectric material block array 102. The dielectric material block array 102 may be formed of the same material and may have the same configuration described with reference to FIG. 8. The plurality of antenna portions may include at least two different types of antenna patterns.

Referring to FIG. 11, the plurality of antenna portions may include a first antenna portion 5041, a second antenna portion 5042, a third antenna portion 5043, a fourth antenna portion 5044, and a fifth antenna portion 5045.

The first antenna portion 5041 may be a first conductor pattern disposed on the first side of the dielectric material block array 102 and may include a metal patch 5041a that is isolated on the sides of the four sequential unit dielectric material blocks 102a, 102b, 102c, and 102d (refer to FIG. 8), is independently disposed, and is operable in the radiation pattern. The second antenna portion 5042 and the fourth antenna portion 5044 may be, respectively, a second conductor pattern and a fourth conductor pattern respectively disposed on the second side and the fourth side of the dielectric material block array 102 . The second antenna portion 5042 and the fourth antenna portion 5044 may respectively include loop antenna patterns 5042a and 5044a positioned on the sides of the four sequential unit dielectric material blocks 102a, 102b, 102c, and 102d. The third antenna portion 5043 and the fifth antenna portion 5045 may be, respectively, a third conductor pattern and a fifth conductor pattern respectively disposed on the third side and the fifth side of the dielectric material block array 102. The third antenna portion 5043 and the fifth antenna portion 5045 may respectively include loop antenna patterns 5043a and 5045a positioned on the outermost lateral sides of the unit dielectric material blocks 102a, and 102d.

The metal patch 5041a configuring the first conductor pattern and the loop antenna patterns 5042a, 5043a, 5044a, and 5045a configuring the second, third, fourth, and fifth conductor patterns may be isolated on the respective sides of the dielectric material block array 102 and may be independently formed. That is, the first, second, third, fourth, and fifth conductor patterns are not connected to each other, and may be antennas respectively driven by first, second, third, fourth, and fifth feed lines 5041b, 5042b, 5043b, 5044b, and 5045b that are individually installed. Therefore, the first antenna portion 5041, the second antenna portion 5042, the third antenna portion 5043, the fourth antenna portion 5044, and the fifth antenna portion 5045 respectively including the first, second, third, fourth, and fifth conductor patterns may be isolated on the respective sides of the dielectric material block array 102 and may be independently formed.

A ground portion 506 may be positioned on the sixth side of the dielectric material block array 102. The ground portion 506 may, for example, be positioned on the entire sixth side of the dielectric material block array 102 excluding the portions where the first, second, third, fourth, and fifth feed lines 5041b, 5042b, 5043b, 5044b, and 5045b are positioned.

Referring to FIG. 12, the plurality of antenna portions may include a first antenna portion 6041, a second antenna portion 6042, a third antenna portion 6043, a fourth antenna portion 6044, and a fifth antenna portion 6045.

The first antenna portion 6041 may be a first conductor pattern disposed on the first side of the dielectric material block array 102 and may include a metal patch 6041a that is isolated on the sides of the four sequential unit dielectric material blocks 102a, 102b, 102c, and 102d (refer to FIG. 8), is independently disposed, and is operable in a radiation pattern. The second antenna portion 6042 and the fourth antenna portion 6044 may be, respectively, a second conductor pattern and a fourth conductor pattern respectively disposed on the second side and the fourth side of the dielectric material block array 102. The second antenna portion 6042 and the fourth antenna portion 6044 may include respective dipole antenna patterns 6042a and 6044a that are isolated on the sides of the four sequential unit dielectric material blocks 102a, 102b, 102c, and 102d. The third antenna portion 6043 and the fifth antenna portion 6045 may be, respectively, a third conductor pattern and a fifth conductor pattern disposed on the third side and the fifth side of the dielectric material block array 102. The third antenna portion 6043 and the fifth antenna portion 6045 may include respective dipole antenna patterns 6043a and 6045a that are respectively isolated on the lateral sides of the outermost unit dielectric material blocks 102a and 102d.

The metal patch 6041a configuring the first conductor pattern and the dipole antenna patterns 6042a, 6043a, 6044a, and 6045a configuring the second, third, fourth, and fifth conductor patterns may be isolated on the respective sides of the dielectric material block array 102 and may be independently formed. That is, the first, second, third, fourth, and fifth conductor patterns are not connected to each other, and the first, second, third, fourth, and fifth conductor patterns may be antennas respectively driven by first, second, third, fourth, and fifth feed lines 6041b, 6042b, 6043b, 6044b, and 6045b that are individually installed. Therefore, the first antenna portion 6041, the second antenna portion 6042, the third antenna portion 6043, the fourth antenna portion 6044, and the fifth antenna portion 6045 respectively including the first, second, third, fourth, and fifth conductor patterns may be isolated on the respective sides of the dielectric material block array 102 and may be independently formed.

A ground portion 606 may be positioned on the sixth side of the dielectric material block array 102. The ground portion 606 may, for example, be positioned on the entire sixth side of the dielectric material block array 102 excluding the portions where the first, second, third, fourth, and fifth feed lines are positioned.

Figure 13:
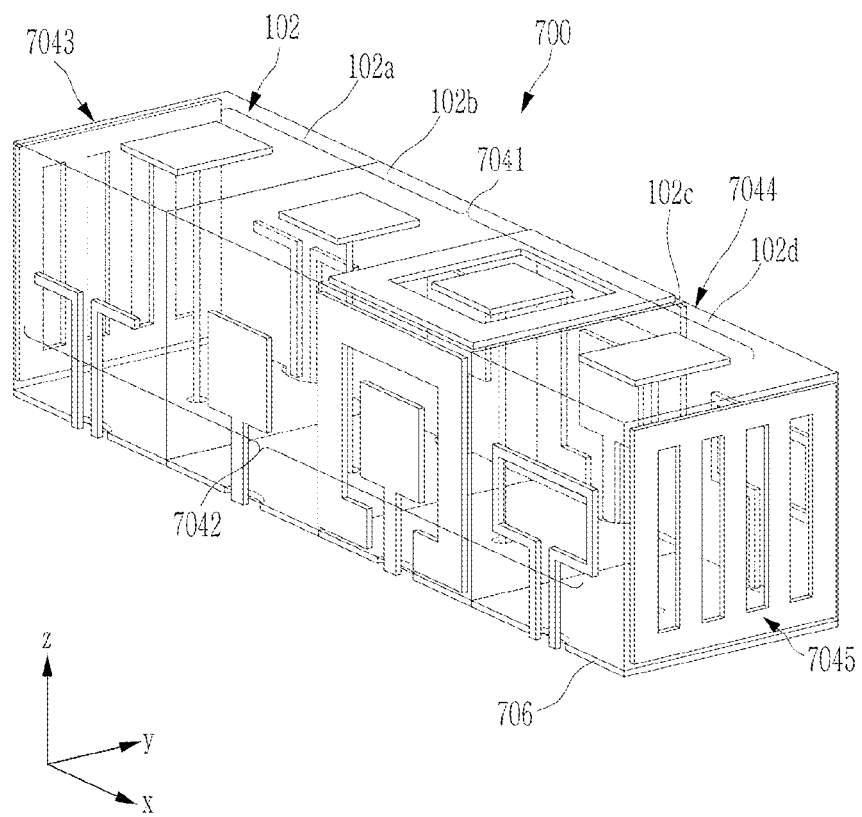
FIG. 13 is a perspective view of a chip antenna, according to another embodiment.

FIG. 13 is a perspective view of a chip antenna 700, according to another embodiment.

Referring to FIG. 13, the chip antenna 700 includes a plurality of antenna portions having conductor patterns disposed on the respective sides of the dielectric material block array 102. The dielectric material block array 102 may be formed of the same material and may have the same configuration described with reference to FIG. 8. The four sequential unit dielectric material blocks 102a, 102b, 102c, and 102d (refer to FIG. 8) may respectively include different antenna patterns.

A plurality of antenna portions may include a first antenna portion 7041, a second antenna portion 7042, a third antenna portion 7043, a fourth antenna portion 7044, and a fifth antenna portion 7045.

The first antenna portion 7041 may be a first conductor pattern disposed on the first side of the dielectric material block array 102 and may include a metal patch isolated on the respective sides of the four sequential unit dielectric material blocks 102a, 102b, 102c, and 102d, independently disposed, and operable in a radiation pattern. The metal patch disposed on the unit dielectric material block 102c may be positioned to be surrounded by the ground pattern spaced therefrom and formed.

The second antenna portion 7042 and the fourth antenna portion 7044 may be, respectively, a second conductor pattern and a fourth conductor pattern respectively disposed on the second side and the fourth side of the dielectric material block array 102, and may sequentially include a dipole antenna pattern, a metal patch, a metal patch surrounded by a ground pattern, and a loop antenna pattern on the respective sides of the four sequential unit dielectric material blocks 102a, 102b, 102c, and 102d.

The third antenna portion 7043 and the fifth antenna portion 7045 may be, respectively, a third conductor pattern and a fifth conductor pattern disposed on the third side and the fifth side of the dielectric material block array 102, and may include slot antenna patterns isolated and positioned on the sides of the outermost unit dielectric material blocks 102a and 102d. The slot antenna patterns are respectively operable in the radiation pattern and may include metal plates in which a plurality of slots are positioned.

The metal patch configuring the first conductor pattern, the metal plates configuring the second conductor pattern and the fourth conductor pattern, and the metal plates configuring the third conductor pattern and the fifth conductor pattern may be isolated on the respective sides of the dielectric material block array 102 and may be independently formed. That is, the first, second, third, fourth, and fifth conductor patterns are not connected to each other, and may be antennas respectively driven by feed lines that are individually installed. Therefore, the first antenna portion 7041, the second antenna portion 7042, the third antenna portion 7043, the fourth antenna portion 7044, and the fifth antenna portion 7045 respectively including the first, second, third, fourth, and fifth conductor patterns may be isolated on the respective sides of the dielectric material block array 102 and may be independently formed.

A ground portion 706 may be positioned on the sixth side of the dielectric material block array 102. The ground portion 706 may, for example, be positioned on the entire sixth side of the dielectric material block array 102 excluding the portions where the feed lines are positioned.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

DESCRIPTION OF SYMBOLS 10, 20, 30, 40, 50, 60, 70: chip antenna
12: dielectric material block
141, 241, 341, 441, 541, 641, 741: first antenna portion
142, 242, 342, 442, 542, 642, 742: second antenna portion 143, 243, 343, 443, 543, 643, 743: third antenna portion
144, 244, 344, 444, 544, 644, 744: fourth antenna portion
145, 245, 445, 545, 645, 745: fifth antenna portion
16, 26, 36, 46, 56, 66, 76: ground portion
100, 200, 300, 500, 600: chip antenna
102: dielectric material block array
102a, 102b, 102c, 102d: unit dielectric material block
1041, 2041, 3041, 5041, 6041, 7041: first antenna portion
1042, 2042, 3042, 5042, 6042, 7042: second antenna portion
1043, 2043, 3043, 5043, 6043, 7043: third antenna portion
1044, 2044, 3044, 5044, 6044, 7044: fourth antenna portion
1045, 2045, 5045, 6045, 7045: fifth antenna portion
106, 206, 306, 506, 606: ground portion

What is claimed is:

1. A chip antenna, comprising:
a dielectric material block comprising a plurality of sides including a first side, a second side, and a third side that are different from each other;
a first antenna portion comprising a first conductor pattern disposed on the first side;
a second antenna portion comprising a second conductor pattern disposed on the second side; and
a third antenna portion comprising a third conductor pattern disposed on the third side,
wherein the first conductor pattern, the second conductor pattern, and the third conductor pattern are respectively isolated on the first side, the second side, and the third side, and are independently positioned.

2. The chip antenna of claim 1, wherein at least one additional side, among the plurality of sides, that is different from the first, second, and third sides includes a ground portion.

3. The chip antenna of claim 1, wherein the first side, the second side, and the third side are orthogonal to each other.

4. The chip antenna of claim 3, wherein the first conductor pattern, the second conductor pattern, and the third conductor pattern include respective metal patches operable in a radiation pattern.

5. The chip antenna of claim 4, wherein the first conductor pattern, the second conductor pattern, and the third conductor pattern further include a respective ground patterns spaced from the respective metal patches and disposed to surround the respective metal patches.

6. The chip antenna of claim 3, wherein the first conductor pattern, the second conductor pattern, and the third conductor pattern are configured to be operated in a radiation pattern, and include respective slot antenna patterns each including a metal plate in which a plurality of slots are positioned.

7. The chip antenna of claim 3, wherein the first conductor pattern, the second conductor pattern, and the third conductor pattern include at least two different types of antenna patterns.

8. The chip antenna of claim 3, wherein the first conductor pattern includes a metal patch operable in a radiation pattern, and
wherein the second conductor pattern and the third conductor pattern include respective loop antenna patterns.

9. The chip antenna of claim 3, wherein the first conductor pattern includes a metal patch operable in a radiation pattern, and
wherein the second conductor pattern and the third conductor pattern include respective dipole antenna patterns.

10. The chip antenna of claim 3, wherein the first conductor pattern includes a metal patch operable in a radiation pattern,
wherein the second conductor pattern includes a dipole antenna pattern, and
wherein the third conductor pattern is operable in the radiation pattern and includes a slot antenna pattern including a metal plate in which a plurality of slots are positioned.

11. The chip antenna of claim 3, wherein the plurality of sides further include a fourth side facing the second side and a fifth side facing the third side, and
wherein the chip antenna further includes a fourth antenna portion comprising a fourth conductor pattern disposed on the fourth side and a fifth antenna portion comprising a fifth conductor pattern disposed on the fifth side.

12. A chip antenna, comprising:
a dielectric material block array comprising a plurality of sides including a first side, a second side, and a third side facing in different directions, the dielectric material block array being formed by a plurality of dielectric material blocks arranged together such that adjacent dielectric material blocks, among the plurality of dielectric material blocks, contact each other;
a first antenna portion comprising a first conductor pattern disposed on the first side;
a second antenna portion comprising a second conductor pattern disposed on the second side; and
a third antenna portion comprising a third conductor pattern disposed on the third side,
wherein the first conductor pattern, the second conductor pattern, and the third conductor pattern are respectively isolated on the first side, the second side, and the third side, and are independently positioned.

13. The chip antenna of claim 12, wherein at least one additional side, among the plurality of sides, that is different from the first, second, and third sides includes a ground portion.

14. The chip antenna of claim 12, wherein the first side, the second side, and the third side are orthogonal to each other.

15. The chip antenna of claim 14, wherein the first conductor pattern, the second conductor pattern, and the third conductor pattern include respective metal patches operable in a radiation pattern.

16. The chip antenna of claim 15, wherein the first conductor pattern, the second conductor pattern, and the third conductor pattern further include respective ground patterns spaced from the respective metal patches and disposed to surround the respective metal patches.

17. The chip antenna of claim 14, wherein the first conductor pattern, the second conductor pattern, and the third conductor pattern include at least two different types of antenna patterns.

18. The chip antenna of claim 12, wherein the first conductor pattern includes a metal patch operable in a radiation pattern, and
wherein the second conductor pattern and third conductor pattern include respective loop antenna patterns.

19. The chip antenna of claim 12, wherein the first conductor pattern includes a metal patch operable in a radiation pattern, and
wherein the second conductor pattern and the third conductor pattern include respective dipole antenna patterns.

20. The chip antenna of claim 12, wherein the first conductor pattern includes a metal patch operable in a radiation pattern, wherein the second conductor pattern includes at least two among a metal patch, a loop antenna pattern, and a dipole antenna pattern operable in the radiation pattern, and wherein the third conductor pattern is operable in the radiation pattern and includes a slot antenna pattern including a metal plate in which a plurality of slots are positioned.

\* \* \* \* \*